US009439306B2

(12) United States Patent
You

(10) Patent No.: US 9,439,306 B2
(45) Date of Patent: Sep. 6, 2016

(54) STAND ASSEMBLY AND ELECTRONIC APPARATUS

(71) Applicant: WISTRON CORP., New Taipei (TW)

(72) Inventor: Gang You, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 14/936,648

(22) Filed: Nov. 9, 2015

(65) Prior Publication Data

US 2016/0066446 A1  Mar. 3, 2016

Related U.S. Application Data

(62) Division of application No. 14/140,525, filed on Dec. 25, 2013, now Pat. No. 9,215,816.

(30) Foreign Application Priority Data

Oct. 14, 2013 (CN) .......................... 2013 1 0479472

(51) Int. Cl.
*F16M 11/38* (2006.01)
*H05K 5/02* (2006.01)
*F16M 11/10* (2006.01)

(52) U.S. Cl.
CPC ............ *H05K 5/0204* (2013.01); *F16M 11/10* (2013.01); *F16M 11/38* (2013.01); *F16M 2200/08* (2013.01)

(58) Field of Classification Search
CPC .... H05K 5/0204; F16M 11/10; F16M 11/38; F16M 2200/08
See application file for complete search history.

(56) References Cited

U.S. PATENT DOCUMENTS

| 4,882,807 | A | * | 11/1989 | Frye | ................. | B60N 2/4606 |
| | | | | | | 16/225 |
| 6,886,701 | B2 | * | 5/2005 | Hong | ................. | F16M 11/10 |
| | | | | | | 211/104 |

(Continued)

FOREIGN PATENT DOCUMENTS

| CN | 202228875 U | 5/2012 |
| WO | 2013/124348 A1 | 8/2013 |

OTHER PUBLICATIONS

The office action of the corresponding Taiwanese application issued on Nov. 11, 2015 and its partial English translation of the marked-up paragraph.

(Continued)

*Primary Examiner* — Jeanette E Chapman
(74) *Attorney, Agent, or Firm* — CKC & Partners Co., Ltd.

(57) ABSTRACT

Stand assembly includes base and first and second stand units. The first stand unit includes first body and extending portion. The first body has first and second ends and first shaft. The extending portion connects the first body and has first shaft hole having first hole portion and second hole portion communicated with each other. The first shaft is pivotally connected to the base. The second stand unit includes second body having third end and second shaft. The second shaft is pivotally connected to the first or second hole portion, selectively. When the second shaft is pivotally connected to the first hole portion, the third end abuts against the second end. When the second shaft is pivotally connected to the second hole portion, the third end leaves the second end, so the second stand unit can rotating relative to the first stand unit.

16 Claims, 15 Drawing Sheets

(56) References Cited

U.S. PATENT DOCUMENTS

| | | | | |
|---|---|---|---|---|
| 7,762,518 B2 * | 7/2010 | Ogawa | ............ | H04N 5/64 248/176.3 |
| 8,061,663 B2 * | 11/2011 | Wang | ............ | F16M 11/10 248/123.11 |
| 8,167,250 B2 * | 5/2012 | White | ............ | H02G 3/0608 248/291.1 |
| 2002/0033436 A1 | 3/2002 | Peng et al. | | |

OTHER PUBLICATIONS

The office action of the corresponding Chinese application issued on Apr. 5, 2016 and its partial English translation of the marked-up paragraph.

* cited by examiner

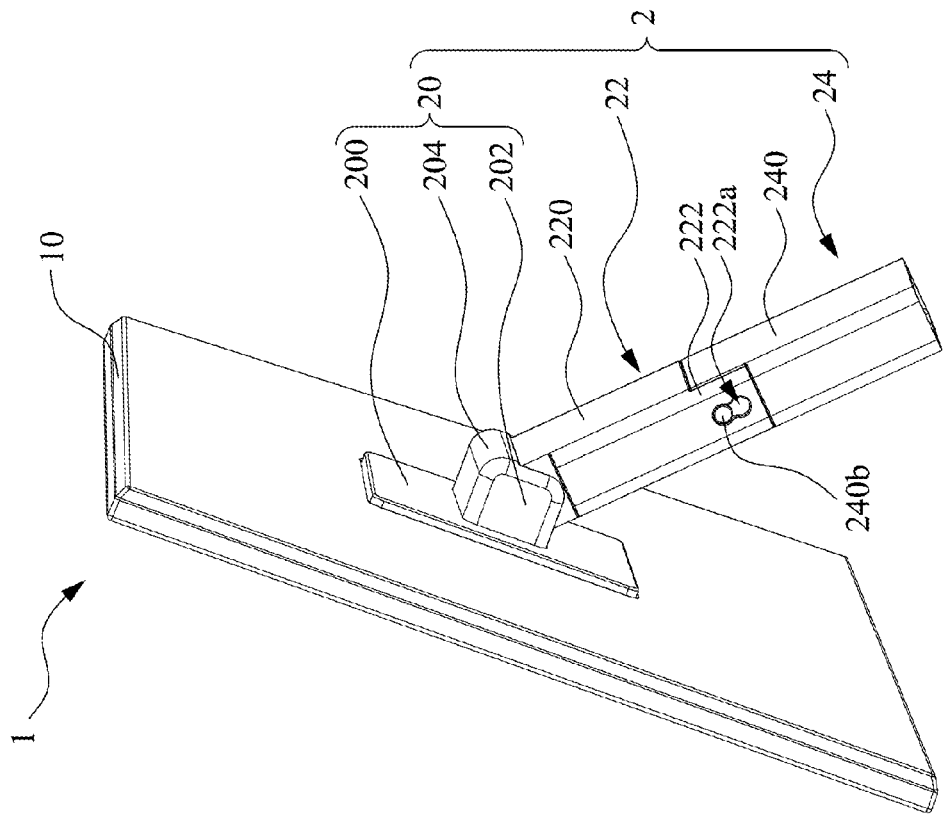
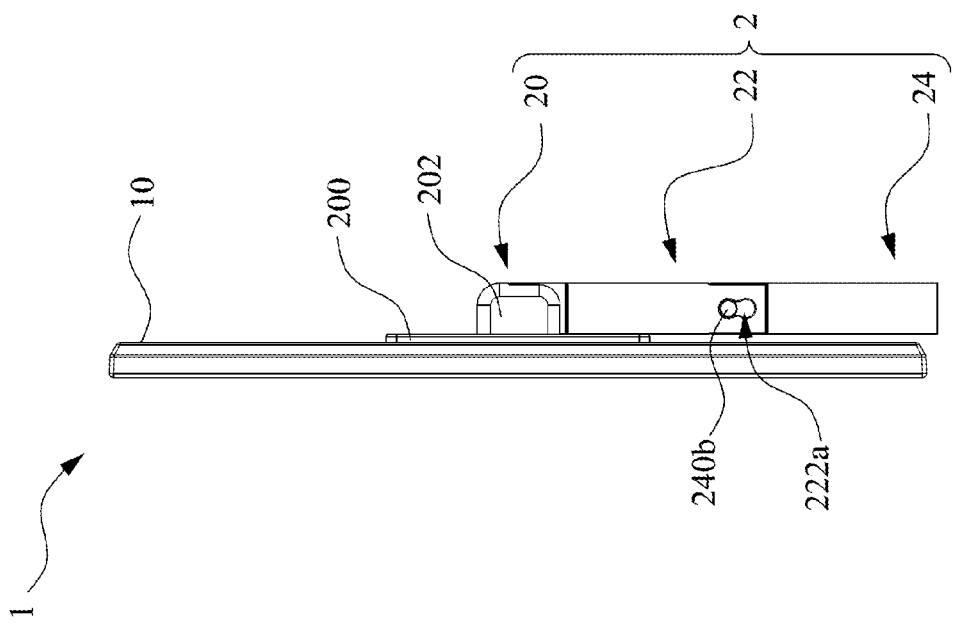
Fig. 1B
Fig. 1A

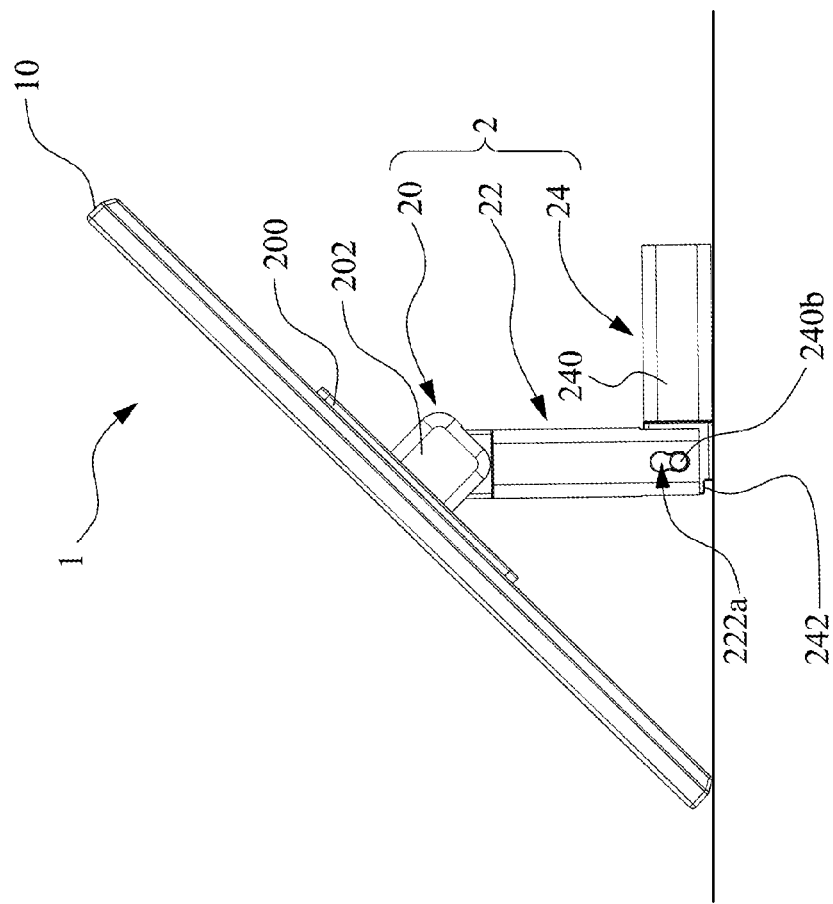
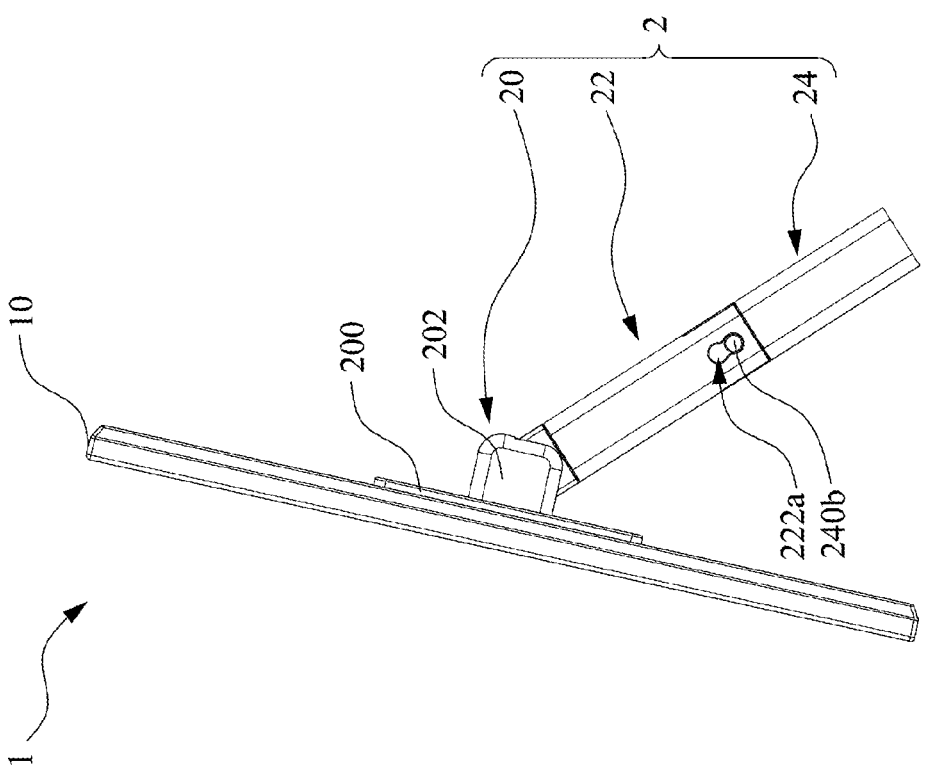

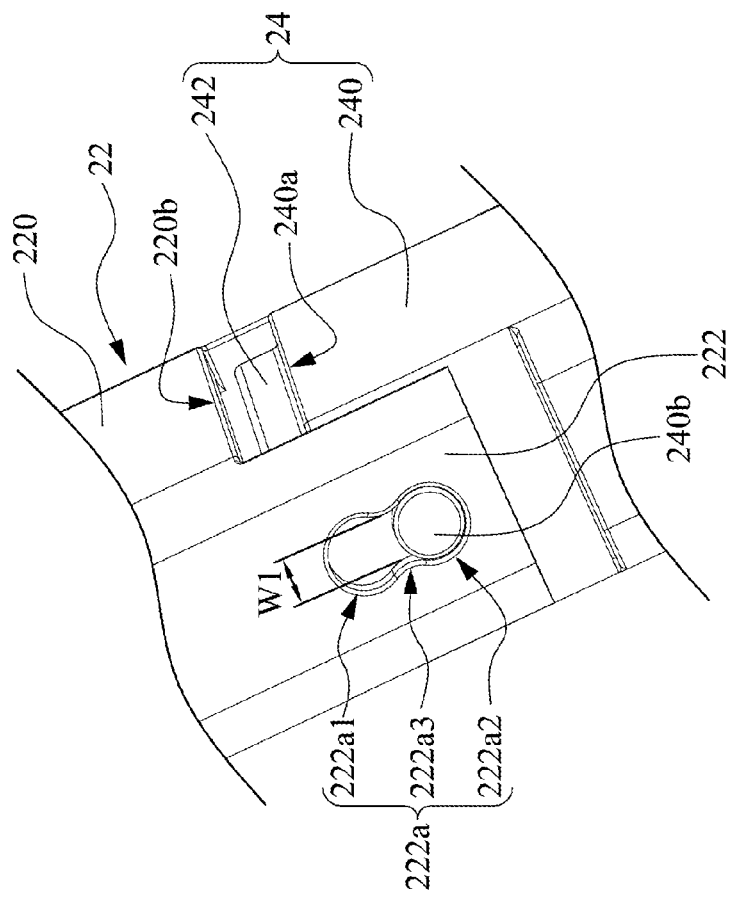
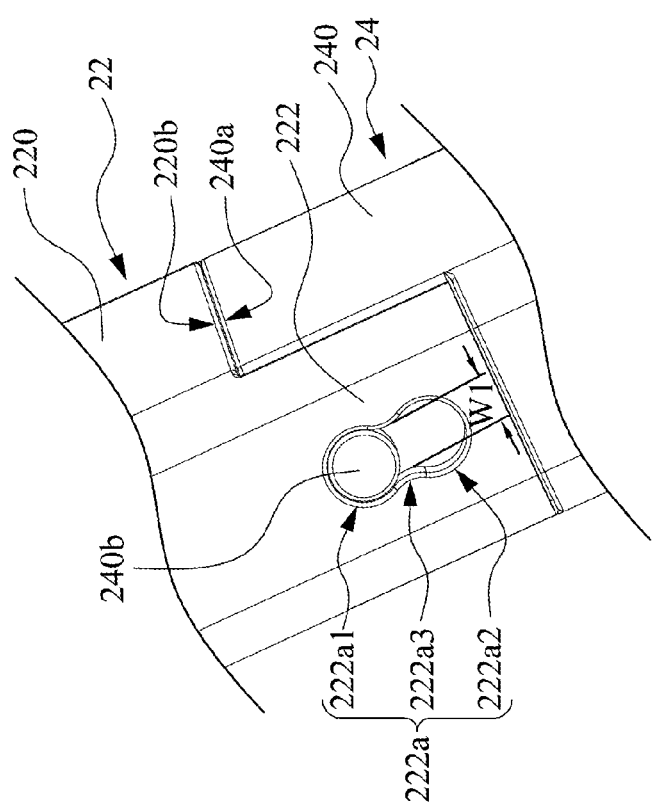
Fig. 4A
Fig. 4B

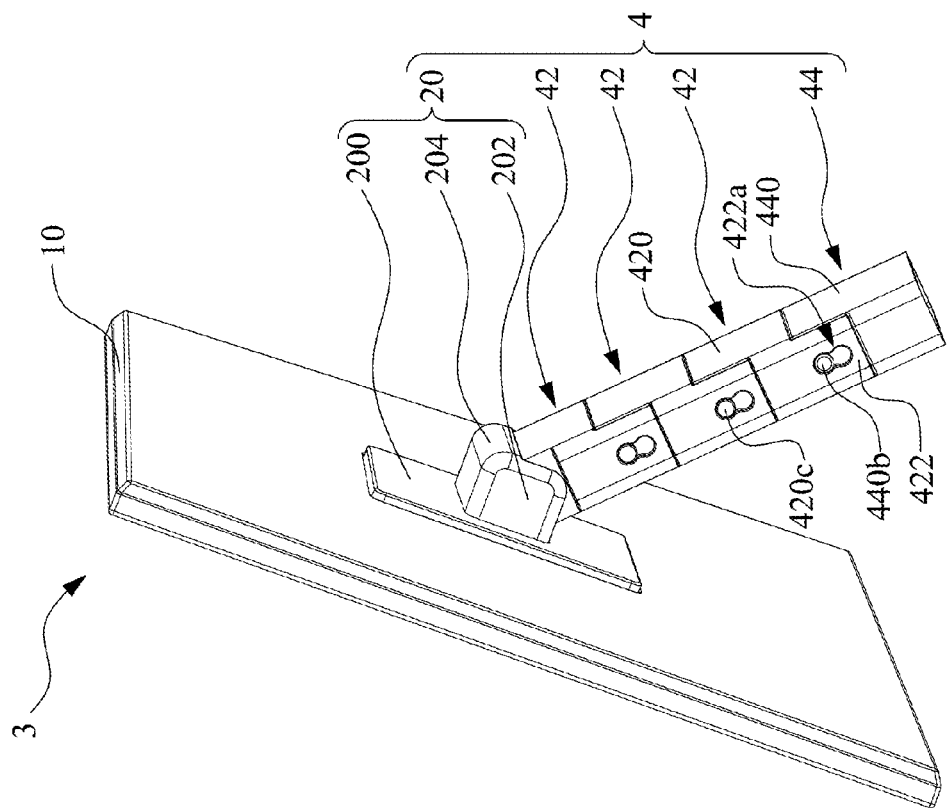
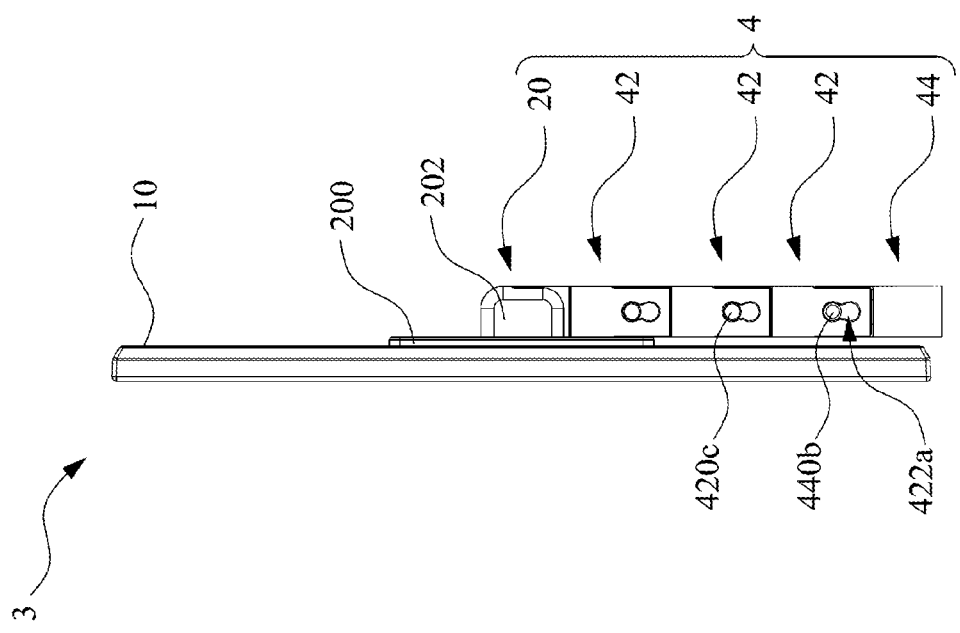

STAND ASSEMBLY AND ELECTRONIC APPARATUS

RELATED APPLICATIONS

The present application is a Divisional Application of the application Ser. No. 14/140,525, filed Dec. 25, 2013, which claims priority to Chinese Application Serial Number 201310479472.5, filed Oct. 14, 2013, all of which are herein incorporated by reference.

BACKGROUND

1. Technical Field

The present disclosure relates to a stand assembly and an electronic apparatus.

2. Description of Related Art

Computers are the most common and convenient tools in modern life that facilitate daily life and work. Because of the following limitations including having a wide variety of peripheral devices, being difficult to install, and only being utilized at fixed points, a typical desktop computer is not portable. A tablet personal computer has an advantage over the desktop computer because it is portable and convenient to use.

However, the tablet personal computer only has a touch screen that causes inconveniences and problems to users when being operated or applied. For example, the touch panel of a tablet personal computer can only be placed horizontally and is not allowed to be placed laterally or leanly. Hence, users need to bow their heads to watch the screen that causes neck and shoulder discomfort. Even if the tablet personal computer leans on another object, inconvenience during operation still exists because the tablet personal computer is not easily to be fixed and tend to slide. With the massive production of tablet personal computers, stands for the tablet personal computers have already been on the market. Or, a tablet personal computer with a stand on the back of its body has been designed to facilitate standing the overall unit on a table and moving the overall unit to the front of users.

However, most of the prior art stands are in the form of support bracket. The expanded prior art stand and the body of the tablet personal computer form a V-shaped structure, and the prior art stand may move telescopically. Its mechanical operation is not novel at all. In addition, a spring is utilized as a fixed point around which torque is generated in most of the prior art stand designs. The spring may become elastically fatigued after prolonged use. Moreover, molds for parts in the prior art stand cannot be shared with different parts to make the cost high. The large overall size also results in a waste of package space.

In order to solve the aforementioned problems, the industry is eager to invest R&D resources so as to provide a stand assembly with novel design concept for the stand.

SUMMARY

A stand assembly for an object is provided. The stand assembly comprises a base, a first stand unit, and a second stand unit. The base is fixed to the object. The first stand unit comprises a first body and an extending portion. The first body has a first end, a second end, and a first shaft. The extending portion is connected to the first body and extends away from the second end of the first body. The extending portion has a first shaft hole having a first hole portion and a second hole portion communicated with each other. The first shaft is pivotally connected to the base. The second stand unit comprises a second body. The second body has a third end and a second shaft. The second shaft is pivotally connected to the first hole portion or the second hole portion selectively. When the second shaft is pivotally connected to the first hole portion, the third end abuts against the second end. When the second shaft is pivotally connected to the second hole portion, the third end leaves the second end so that the second stand unit is capable of rotating relative to the first stand unit.

In the foregoing, the first shaft hole further comprises a first tightening portion raising between the first hole portion and the second hole portion. The first shaft hole has a first minimum width at the first tightening portion. The first minimum width is less than a diameter of the second shaft. The second shaft is pivotally connected to the first hole portion or the second hole portion selectively by passing through the first tightening portion.

In the foregoing, the first body further comprises a first engaging slot located at the second end. The second stand unit further comprises a first engaging portion. The first engaging portion is connected to the second body and located at the third end. When the second shaft is pivotally connected to the first hole portion and the third end abuts against the second end, the first engaging portion is engaged with the first engaging slot.

In the foregoing, the base comprises a bottom plate and a pivoting portion. The bottom plate is fixed to the object. The pivoting portion is connected to the bottom plate. The pivoting portion has a second shaft hole having a third hole portion and a fourth hole portion communicated with each other. The first shaft is pivotally connected to the third hole portion or the fourth hole portion selectively.

In the foregoing, the second shaft hole further comprises a second tightening portion raising between the third hole portion and the fourth hole portion. The second shaft hole has a second minimum width at the second tightening portion. The second minimum width is less than a diameter of the first shaft. The first shaft is pivotally connected to the third hole portion or the fourth hole portion selectively by passing through the second tightening portion.

In the foregoing, the base further comprises a stop portion connected to the bottom plate. When the first shaft is pivotally connected to the third hole portion, the first body abuts against the bottom plate and the first end abuts against the stop portion. When the first shaft is pivotally connected to the fourth hole portion, the first end leaves the stop portion so that the first stand unit is capable of rotating relative to the pivoting portion. When the first shaft is pivotally connected to the fourth hole portion and the first stand unit abuts against the stop portion by rotating from the bottom plate, the first stand unit has been rotated a predetermined angle relative to the pivoting portion.

In the foregoing, the stop portion has a second engaging slot. The first stand unit further comprises a second engaging portion. The second engaging portion is connected to the first body and located at the first end. When the first shaft is pivotally connected to the third hole portion and the first end abuts against the stop portion, the second engaging portion is engaged with the second engaging slot.

The disclosure provides a stand assembly for an object. The stand assembly comprises a base, a plurality of first stand units, and a second stand unit. The base is fixed to the object. Each of the first stand units comprises a first body and an extending portion. The first body has a first end, a second end, and a first shaft. The extending portion is connected to the first body and extends away from the second end of the first body. The extending portion has a first shaft hole having a first hole portion and a second hole portion communicated with each other. The second stand unit comprises a second body. The second body has a third end and a second shaft. The base, the plurality of first stand units, and the second stand unit are sequentially connected. The first shaft of the first stand unit connected to the base is pivotally connected to the base. The first shaft of each of the other first stand units is pivotally connected to the first hole portion or the second hole portion of the first stand unit corresponding to said each of the other first stand units selectively. When the first shaft of said each of the other first stand units is pivotally connected to the first hole portion of the corresponding first stand unit, the first end of said each of the other first stand units abuts against the second end of the corresponding first stand unit. When the first shaft of said each of the other first stand units is pivotally connected to the second hole portion of the corresponding first stand unit, the first end of said each of the other first stand units leaves the second end of the corresponding first stand unit so that said each of the other first stand units is capable of rotating relative to the corresponding first stand unit. The second shaft is pivotally connected to the first hole portion or the second hole portion of the first stand unit corresponding to the second stand unit selectively. When the second shaft is pivotally connected to the first hole portion of the corresponding first stand unit, the third end abuts against the second end of the corresponding first stand unit. When the second shaft is pivotally connected to the second hole portion of the corresponding first stand unit, the third end leaves the second end of the corresponding first stand unit so that the second stand unit is capable of rotating relative to the corresponding first stand unit.

The disclosure further provides an electronic apparatus comprising a chassis and the above stand assembly, and the base of the stand assembly is connected to the chassis.

In summary, the base, the first stand unit(s), and the second stand unit of the present disclosure stand assembly are connected in sequence. Each of the two first stand units connected together can be rotated relative to the other first stand unit selectively, or each of the first stand unit and the second stand unit connected together can be rotated relative to each other. In this manner, the angle between the object being supported by the stand assembly (or the chassis of the electronic apparatus in the present disclosure) and the horizontal plane can be adjusted effectively. The present disclosure stand assembly achieves the supporting functions by assembling units to allow users to randomly adjust the angle and abandon the prior art stand assembly design in which the supporting function is achieved by torque provided by a spring. Cost is also reduced because molds can be shared by each of the stand units. In addition, the whole stand assembly can be arranged in a line and adheres to the object (or the chassis of the electronic apparatus in the present disclosure) so as to be packaged conveniently and save cost of packaging material and packaging time.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 1A depicts a side view of an electronic apparatus according one embodiment of this disclosure wherein a stand assembly is in an accommodation state;

FIG. 1B depicts a side view of the electronic apparatus in FIG. 1A wherein the stand assembly is in an extended state;

FIG. 3A and FIG. 3B sequentially depict a two-step operation of FIG. 1B to show a support mode of the stand assembly;

FIG. 4A depicts a partial enlarged view of FIG. 1B;

FIG. 4B depicts a partial enlarged view of FIG. 3A;

FIG. 6A depicts a side view of an electronic apparatus according to another embodiment of this disclosure wherein a stand assembly is in an accommodation state;

FIG. 6B depicts a side view of the electronic apparatus in FIG. 6A wherein the stand assembly is in an extended state;

DETAILED DESCRIPTION

Figure 2:
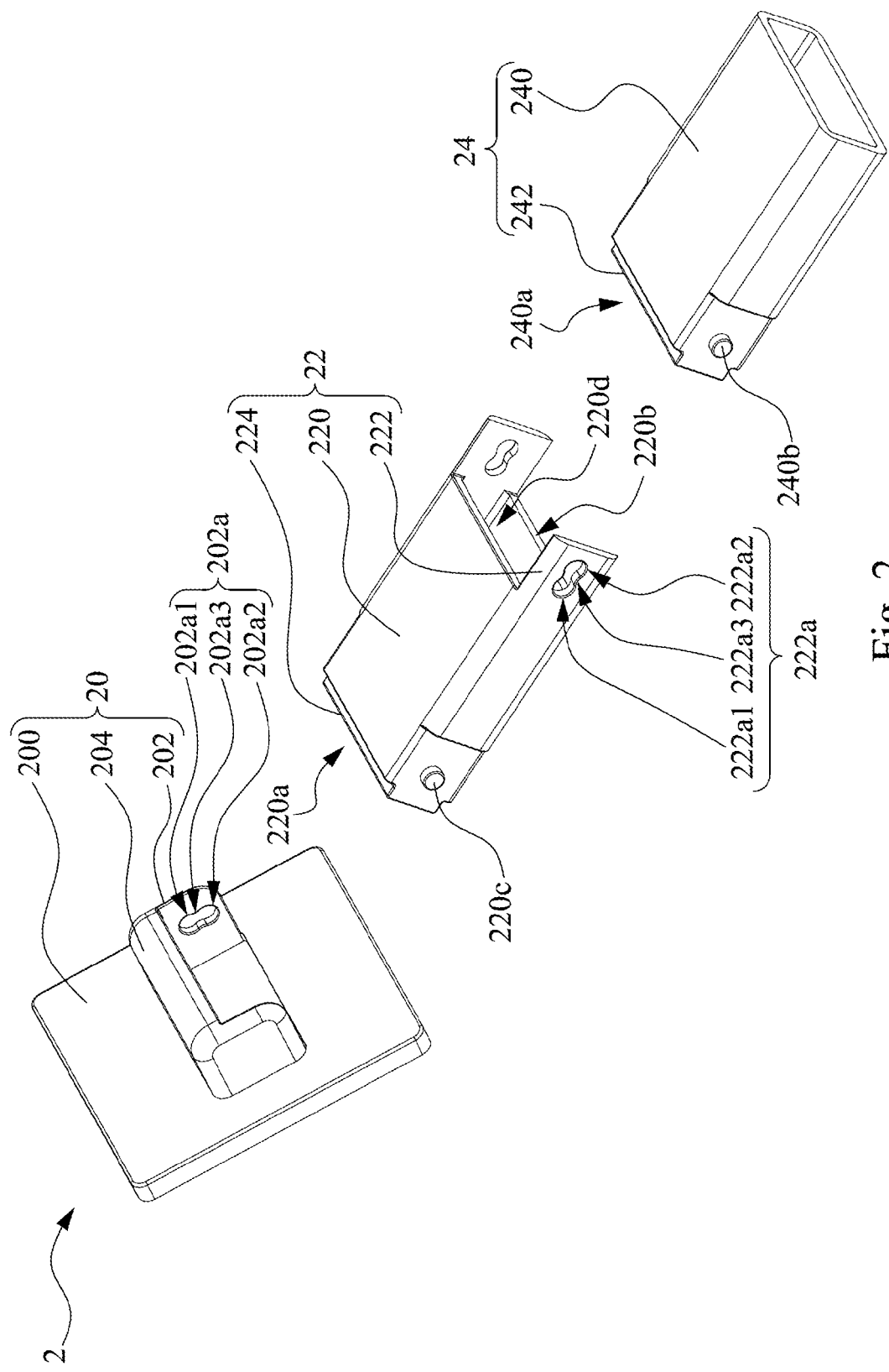
FIG. 2 depicts an exploded view of the stand assembly in FIG. 1B.

Reference will now be made in detail to the present embodiments of the disclosure, examples of which are illustrated in the accompanying drawings. Wherever possible, the same reference numbers are used in the drawings and the description to refer to the same or like parts.

In the following description, for purposes of explanation, numerous specific details are set forth as follows. However, it should be understood that such description is only to illustrate and not to limit the scope of the disclosure. It may be evident, in some embodiments of the disclosure, the claimed subject matter may be practiced without these specific details. In addition, known structures and components are depicted schematically to simplify the drawings.

FIG. 1A depicts a side view of an electronic apparatus 1 according one embodiment of this disclosure wherein a stand assembly 2 is in an accommodation state. FIG. 1B depicts a side view of the electronic apparatus in FIG. 1A wherein the stand assembly 2 is in an extended state. FIG. 2 depicts an exploded view of the stand assembly 2 in FIG. 1B.

As shown in FIG. 1A to FIG. 2, the electronic apparatus 1 comprises a chassis 10 and a stand assembly 2 according to the present embodiment. The stand assembly 2 comprises a base 20, a first stand unit 22, and a second stand unit 24. The base 20 of the stand assembly 2 is fixed to a back of the chassis 10. The first stand unit 22 of the stand assembly 2 comprises a first body 220 and an extending portion 222. The first body 220 has a first end 220a, a second end 220b, and a first shaft 220c. The first shaft 220c is located on a sidewall of the first body 220a and between the first end 220a and the second end 220b. The extending portion 222 is connected to the first body 220, and extends away from the second end 220b of the first body 220. The extending portion 222 has a first shaft hole 222a. The first shaft hole 222a has a first hole portion 222a1 and a second hole portion 222a2 communicated with each other. The first shaft 220c of the first body 220 is pivotally connected to the base 20. The second stand unit 24 of the stand assembly 2 comprises a second body 240. The second body 240 has a third end 240a and a second shaft 240b.

In the present embodiment, the electronic apparatus 1 is a tablet personal computer. However, the present disclosure is not limited in this regard.

FIG. 3A and FIG. 3B sequentially depict a two-step operation of FIG. 1B to show a support mode of the stand assembly 2.

As shown in FIG. 3A and FIG. 3B, the second shaft 240b of the second stand unit 24 is pivotally connected to the first hole portion 222a1 or the second hole portion 222a2 of the first shaft hole 222a of the first stand unit 22 selectively according to the present embodiment. When the second shaft 240b is pivotally connected to the first hole portion 222a1, the third end 240a of the second body 240 abuts against the second end 220b of the first body 220 (see FIG. 1B). Hence, the first body 220 of the first stand unit 22 prevents the second body 240 of the second stand unit 24 from rotating. Conversely, when the second shaft 240b is pivotally connected to the second hole portion 222a2, the third end 240a of the second body 240 leaves the second end 220b of the first body 220 so that the second stand unit 24 is capable of rotating relative to the first stand unit 22 (see FIG. 3A and FIG. 3B).

FIG. 4A depicts a partial enlarged view of FIG. 1B. FIG. 4B depicts a partial enlarged view of FIG. 3A.

As shown in FIG. 4A and FIG. 4B, in the present embodiment, the first shaft hole 222a of the first extending portion 222 further comprises a first tightening portion 222a3 raising between the first hole portion 222a1 and the second hole portion 222a2. The first shaft hole 222a has a first minimum width W1 at the first tightening portion 222a3. The first minimum width W1 is less than a diameter of the second shaft 240b. In the present embodiment, the base 20, the first stand unit 22, and the second stand unit 24 of the stand assembly 2 are all made of plastic material. With such a configuration, the second shaft 240b can be pivotally connected to the first hole portion 222a1 or the second hole portion 222a2 selectively by passing through the first tightening portion 222a3 through compression deformation.

Also shown in FIG. 2, FIG. 4A, and FIG. 4B, according to the present embodiment, the first body 220 of the first stand unit 22 further comprises a first engaging slot 220d located at the second end 220b of the first body 220. The second stand unit 24 further comprises a first engaging portion 242. The first engaging portion 242 is connected to the second body 240 and located at the third end 240a of the second body 240. When the second shaft 240b is pivotally connected to the first hole portion 222a1 of the first shaft hole 222a and the third end 240a of the second body 240 abuts against the second end 220b of the first body 220, the first engaging portion 242 of the second stand unit 24 is engaged with the first engaging slot 220d of the first body 220.

In the present embodiment, the first engaging portion 242 of the second stand unit 24 is in a shape of ring. The first engaging portion 242 is tightly fitted with an inner wall of the first engaging slot 220d of the first body 220, but the present disclosure is not limited in this regard. Hence, when the second shaft 240b is pivotally connected to the first hole portion 222a1 of the first shaft hole 222a, not only will the first tightening portion 222a3 prevent the second shaft 240b from moving to the second hole portion 222a2, but the tight fit between the first engaging portion 242 and the first engaging slot 220d will also prevent the second shaft 240b from moving to the second hole portion 222a2.

Figure 5:
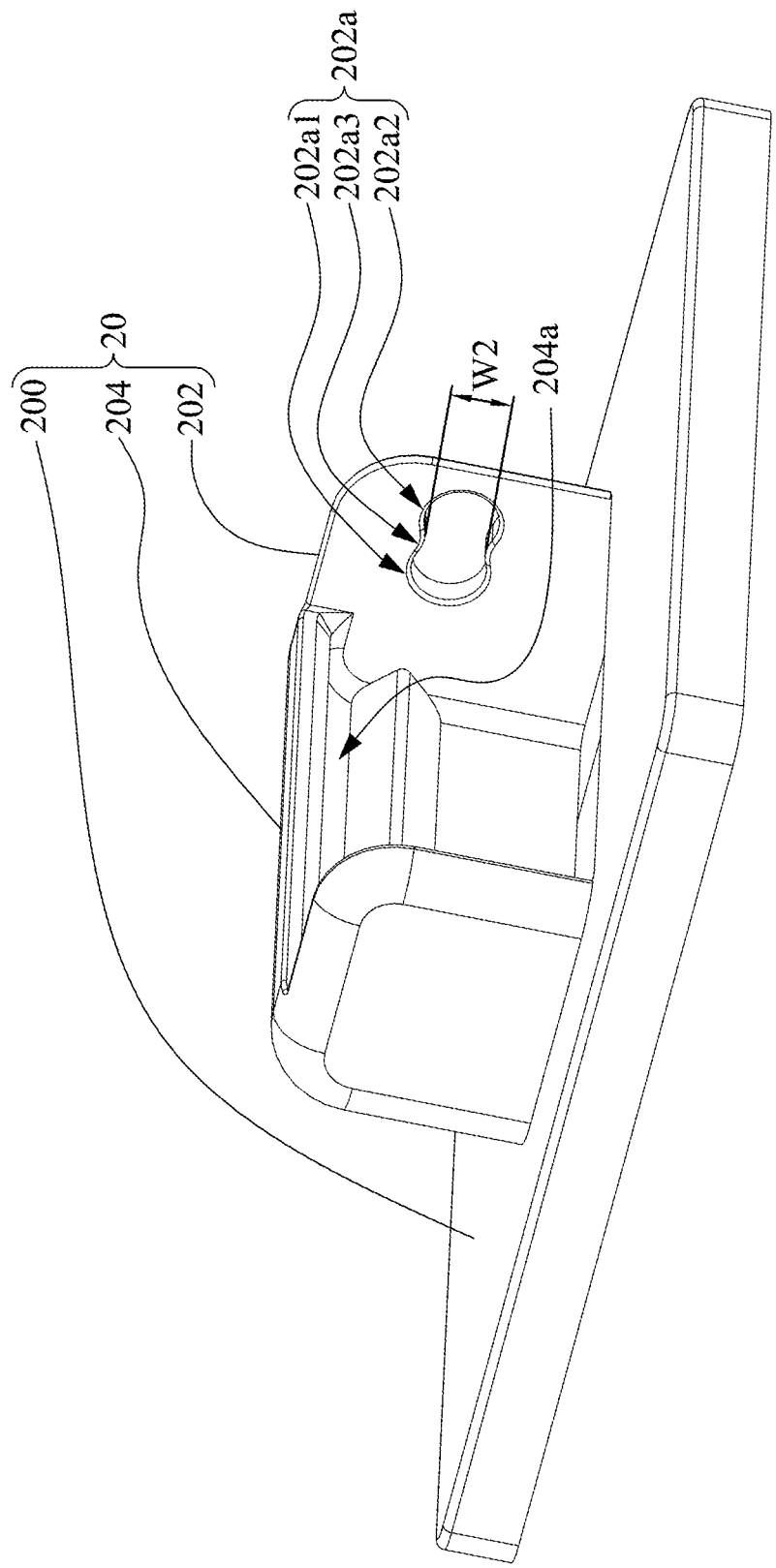
FIG. 5 depicts a perspective view of the base in FIG. 2.

FIG. 5 depicts a perspective view of the base 20 in FIG. 2.

As shown in FIG. 5, the base 20 of the stand assembly 2 comprises a bottom plate 200 and a pivoting portion 202 according to the present embodiment. The bottom plate 200 is fixed to the back of the chassis 10. The pivoting portion 202 is connected to the bottom plate 200 and has a second shaft hole 202a. The second shaft hole 202a has a third hole portion 202a1 and a fourth hole portion 202a2 communicated with each other. The first shaft 220c of the first stand unit 22 is pivotally connected to the third hole portion 202a1 or the fourth hole portion 202a2 selectively.

In the present embodiment, the bottom plate 200 of the base 20 is adhered to the back of the chassis 10, but the present disclosure is not limited in this regard. In practical applications, the bottom plate 200 of the base 20 may be fixed to the back of the chassis 10 by screw tightening.

In addition, the second shaft hole 202a further comprises a second tightening portion 202a3 raising between the third hole portion 202a1 and the fourth hole portion 202a2. The second shaft hole 202a has a second minimum width W2 at the second tightening portion 202a3. The second minimum width W2 is less than a diameter of the first shaft 220c. With such a configuration, the first shaft 220c can be pivotally connected to the third hole portion 202a1 or the fourth hole portion 202a2 selectively by passing through the second tightening portion 202a3 through compression deformation.

Additionally, the base 20 of the stand assembly 2 further comprises a stop portion 204. The stop portion 204 is connected to the bottom plate 200 and located in the rotating path of the first stand unit 22 relative to the pivoting portion 202. When the first shaft 220c of the first stand unit 22 is pivotally connected to the third hole portion 202a1 of the second shaft hole 202a, the first body 220 abuts against the bottom plate 200, and the first end 220a of the first body 220 abuts against the stop portion 204 (see FIG. 1A). When the first shaft 220c of the first stand unit 22 is pivotally connected to the fourth hole portion 202a2 of the second shaft hole 202a, the first end 220a of the first body 220 leaves the stop portion 204 so that the first stand unit 22 is capable of rotating relative to the pivoting portion 202. In addition to that, when the first shaft 220c of the first stand unit 22 is pivotally connected to the fourth hole portion 202a2 of the second shaft hole 202a and the first stand unit 22 abuts against the stop portion 204 by rotating from the bottom plate 200, the first stand unit 22 actually has been rotated a predetermined angle relative to the pivoting portion 202.

According to the present embodiment, the above-mentioned predetermined angle is 45 degrees. In FIG. 1B, an angle formed between the chassis 10 and the horizontal plane is 80 degrees. In FIG. 3B, an angle formed between the chassis 10 and the horizontal plane is 45 degrees. However, the present disclosure is not limited in this regard.

Similarly, as shown in FIG. 5, the stop portion 204 of the base 20 has a second engaging slot 204a according to the present embodiment. The first stand unit 22 further comprises a second engaging portion 224. The second engaging portion 224 is connected to the first body 220 and located at the first end 220a of the first body 220. When the first shaft 220c of the first stand unit 22 is pivotally connected to the third hole portion 202a1 of the second shaft hole 202a and the first end 220a of the first body 220 abuts against the stop portion 204, the second engaging portion 224 of the first stand unit 22 is engaged with the second engaging slot 204a of the stop portion 204.

In the present embodiment, the second engaging portion 224 of the first stand unit 22 is in a shape of ring. The second engaging portion 224 is tightly fitted with an inner wall of the second engaging slot 204a of the stop portion 204, but the present disclosure is not limited in this regard. Hence, when the first shaft 220c is pivotally connected to the third hole portion 202a1 of the second shaft hole 202a, not only will the second tightening portion 202a3 prevent the first shaft 220c from moving to the fourth hole portion 202a2, but the tight fit between the second engaging portion 224 and the second engaging slot 204a will also prevent the first shaft 220c from moving to the fourth hole portion 202a2.

Figure 7:
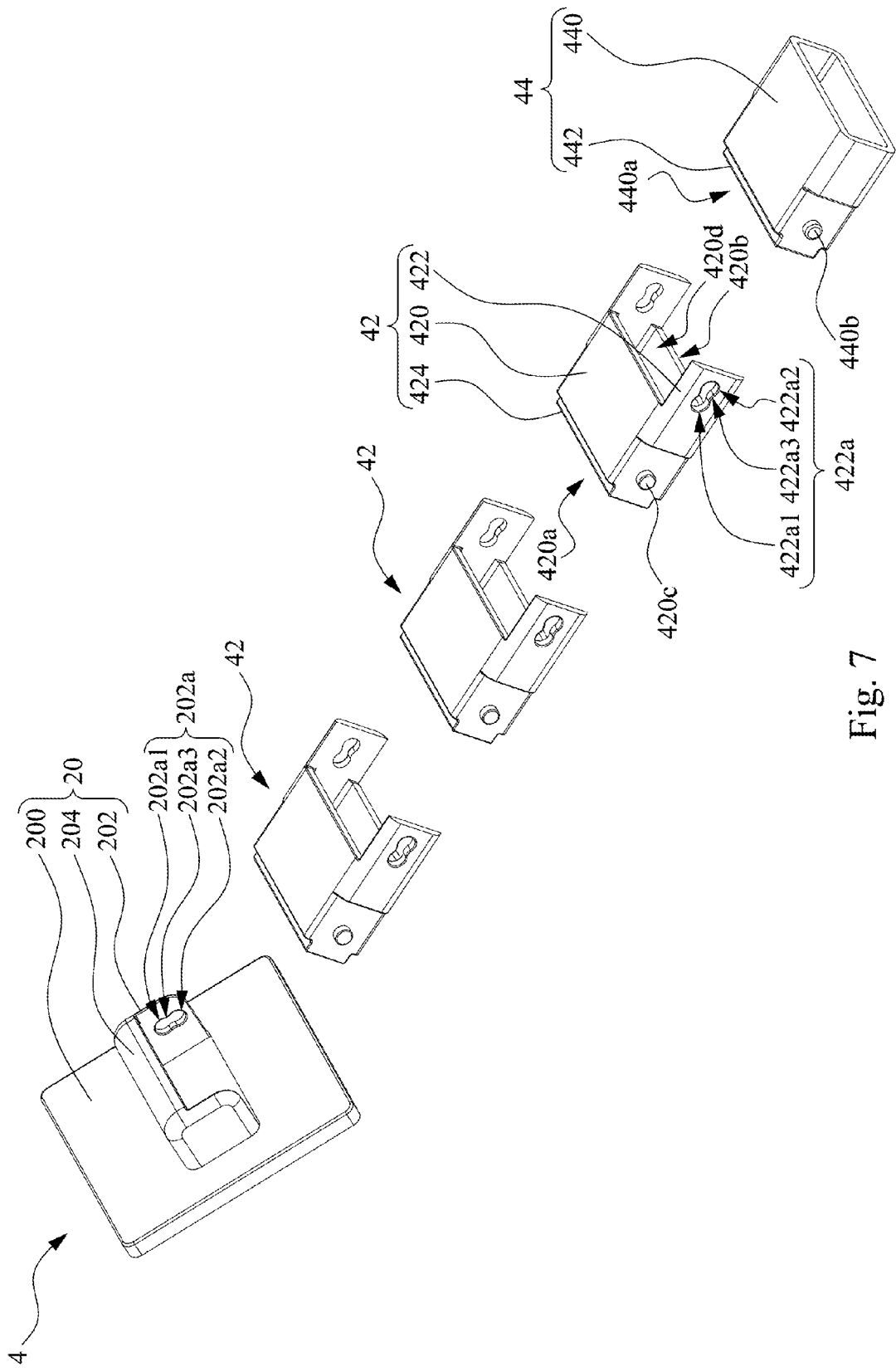
FIG. 7 depicts an exploded view of the stand assembly in FIG. 6B.

FIG. 6A depicts a side view of an electronic apparatus 3 according to another embodiment of this disclosure wherein a stand assembly 4 is in an accommodation state. FIG. 6B depicts a side view of the electronic apparatus 3 in FIG. 6A wherein the stand assembly 4 is in an extended state. FIG. 7 depicts an exploded view of the stand assembly 4 in FIG. 6B.

As shown in FIG. 6A to FIG. 7, the electronic apparatus 3 comprises a chassis 10 and a stand assembly 4 according to the present embodiment. The stand assembly 4 comprises a base 20, a plurality of first stand units 42, and a second stand unit 44. The base 20 is fixed to a back of the chassis 10. Each of the first stand units 42 comprises a first body 420 and an extending portion 422. The first body 420 has a first end 420a, a second end 420b, and a first shaft 420c. The extending portion 422 is connected to the first body 420, and extends away from the second end 420b of the first body 420. The extending portion 422 has a first shaft hole 422a. The first shaft hole 422a has a first hole portion 422a1 and a second hole portion 422a2 communicated with each other. The second stand unit 44 comprises a second body 440. The second body 440 has a third end 440a and a second shaft 440b. The base 20, the plurality of first stand units 42, and the second stand unit 44 of the stand assembly 4 are sequentially connected (that is, are connected one by one). The first shaft 420c of the first stand unit 42 connected to the base 20 (that is the first stand unit 42 at the upper left most corner of FIG. 7) is pivotally connected to the base 20. The first shaft 420c of each of the other first stand units 42 is pivotally connected to the first hole portion 422a1 or the second hole portion 422a2 of the first stand unit 42 corresponding to the each of the other first stand units 42 selectively. The second shaft 440b of the second stand unit 44 is pivotally connected to the first hole portion 422a1 or the second hole portion 422a2 of the first stand unit 42 corresponding to the second stand unit 44 (that is the first stand unit 42 at the lower right most corner of FIG. 7) selectively.

Figure 8A:
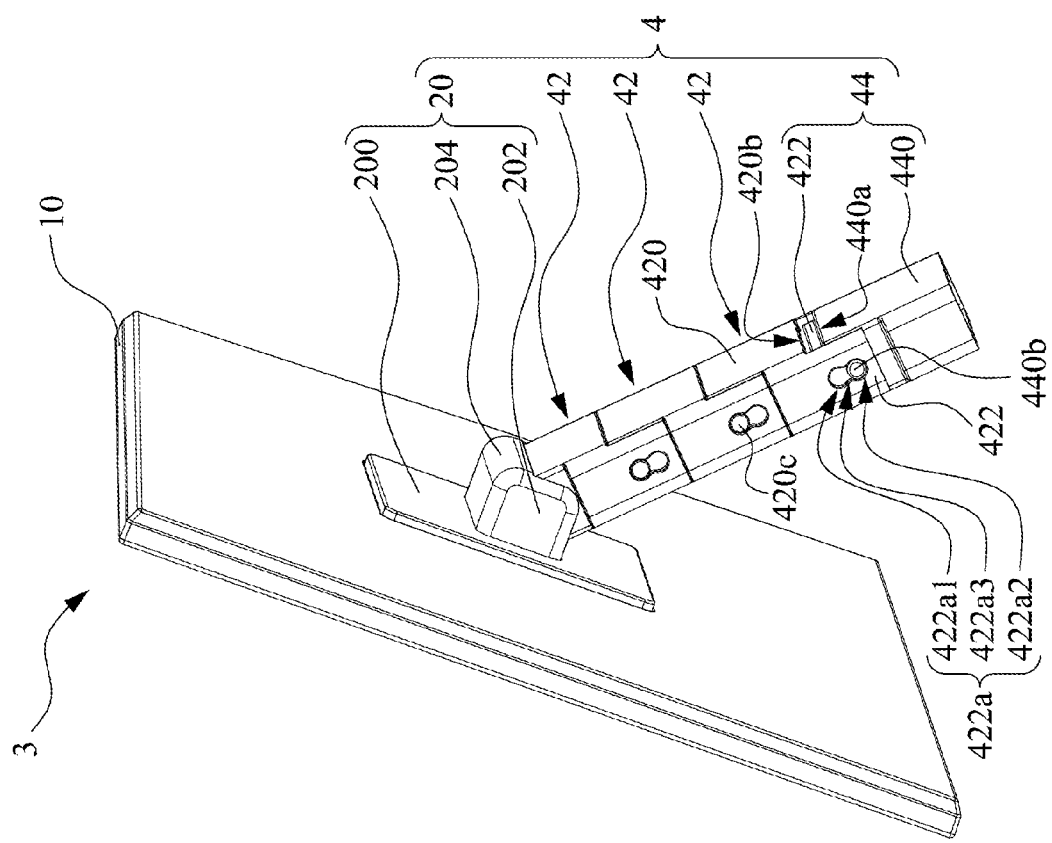
FIG. 8A and FIG. 8B sequentially depict a two-step operation of FIG. 6B to show a support mode of the stand assembly.
Figure 8B:
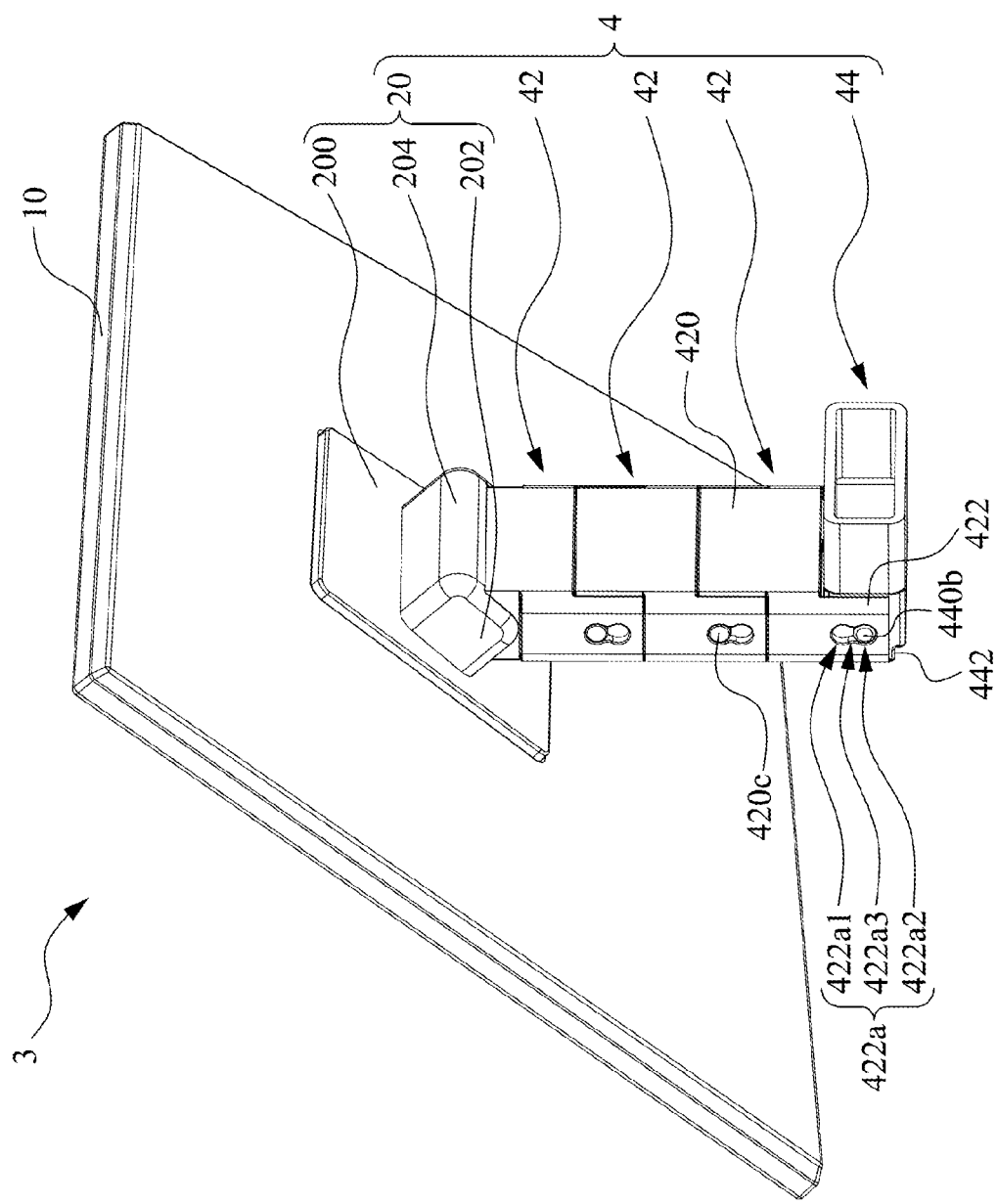

FIG. 8A and FIG. 8B sequentially depict a two-step operation of FIG. 6B to show a support mode of the stand assembly 4.

As shown in FIG. 8A and FIG. 8B, according to the present embodiment, when the second shaft 440b of the second stand unit 44 is pivotally connected to the first hole portion 422a1 of the corresponding first stand unit 42, the third end 440a of the second body 440 abuts against the second end 420b of the first body 420 of the corresponding first stand unit 42. When the second shaft 440b of the second stand unit 44 is pivotally connected to the second hole portion 422a2 of the corresponding first stand unit 42, the third end 440a of the second body 440 leaves the second end 420b of the corresponding first stand unit 42 so that the second stand unit 44 is capable of rotating relative to the corresponding first stand unit 42.

Figure 9A:
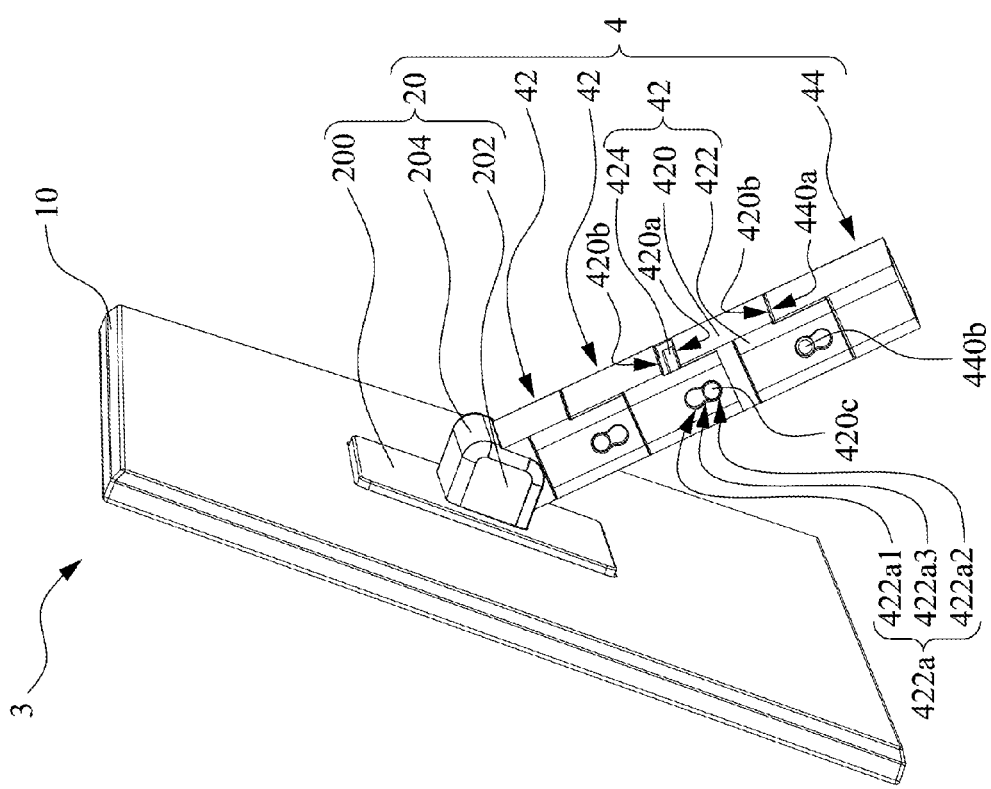
FIG. 9A and FIG. 9B sequentially depict another two-step operation of FIG. 6B to show another support mode of the stand assembly.
Figure 9B:
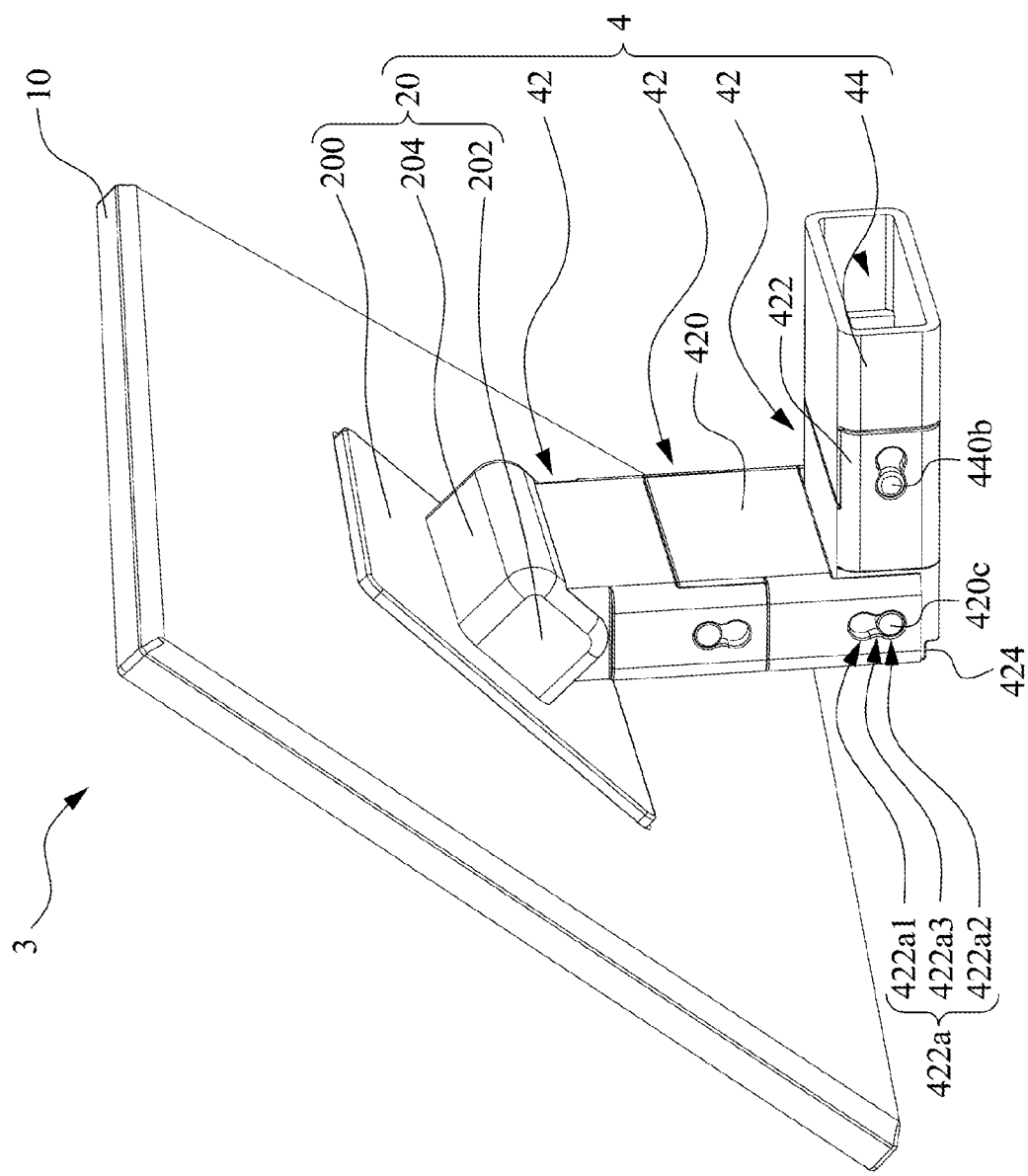
Figure 10A:
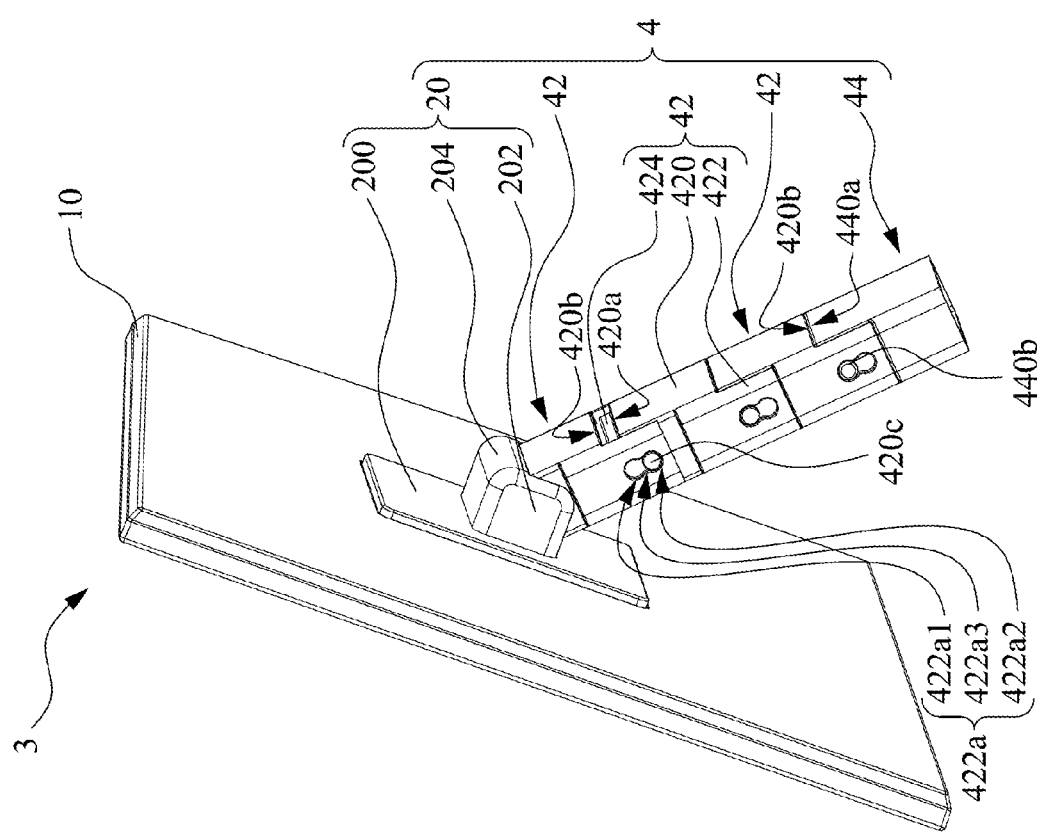
FIG. 10A and FIG. 10B sequentially depict yet another two-step operation of FIG. 6B to show yet another support mode of the stand assembly.
Figure 10B:
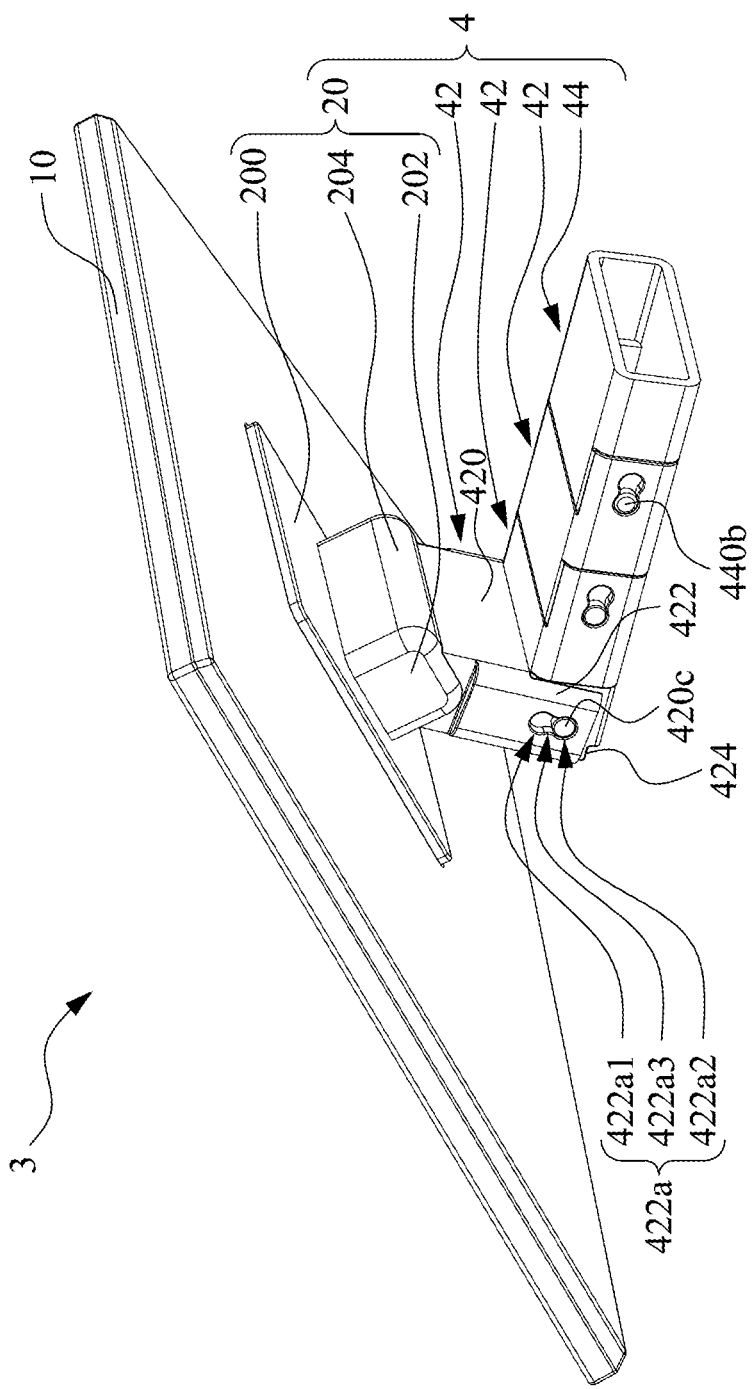

FIG. 9A and FIG. 9B sequentially depict another two-step operation of FIG. 6B to show another support mode of the stand assembly 4. FIG. 10A and FIG. 10B sequentially depict yet another two-step operation of FIG. 6B to show yet another support mode of the stand assembly 4.

As shown in FIG. 9A to FIG. 10B, except for the first stand unit 42 pivotally connected to the base 20 (that is the first stand unit 42 at the upper left most corner of FIG. 7), the first end 420a of the first body 420 of each of the other first stand units 42 abuts against the second end 420b of the first body 420 of the corresponding first stand unit 42 when the first shaft 420c of the each of the other first stand units 42 is pivotally connected to the first hole portion 422a1 of the corresponding first stand unit 42 according to the present embodiment. When the first shaft 420c of the each of the other first stand units 42 is pivotally connected to the second hole portion 422a2 of the corresponding first stand unit 42, the first end 420a of the first body 420 of the each of the other first stand units 42 leaves the second end 420b of the first body 420 of the corresponding first stand unit 42 so that the each of the other first stand units 42 is capable of rotating relative to the corresponding first stand unit 42.

In the present embodiment, the first shaft hole 422a of each of the first stand units 42 further comprises a first tightening portion 422a3. Since the structure of the first shaft hole 422a of the first stand unit 42 according to the present embodiment is the same as the structure of the first shaft hole 222a shown in FIG. 4A and FIG. 4B, corresponding description may be referred to and a description in this regard is not provided in the following. It is noted that the first shaft hole 422a has a minimum width W1 less than a diameter of any of the first shafts 420c and the second shaft 440b at the first tightening portion 422a3.

The structures of the bottom plate 200, the pivoting portion 202 and the second shaft hole 202 of the pivoting portion 202, and the stop portion 204 and the second engaging slot 204 of the stop portion 204 in the base 20 according to the present embodiment are the same as the structures of those in the base 20 shown in FIG. 2 and FIG. 5. Therefore, corresponding description may be referred to and a description in this regard is not provided in the following.

Because the connection between the base 20 and the first stand unit 42 pivotally connected to the base 20 (that is the first stand unit 42 at the upper left most corner of FIG. 7) according to the present embodiment is the same as the connection between the base 20 and the first stand unit 22 shown in FIG. 1A and FIG. 1B, corresponding description may be referred to and a description in this regard is not provided in the following.

With additional reference to FIG. 7, according to the present embodiment, each of the first bodies 420 further comprises a first engaging slot 420d located at the second end 420b of the first body 420. The second stand unit 44 further comprises a first engaging portion 442. The first engaging portion 442 is connected to the second body 440 and located at the third end 440a of the second body 440. When the second shaft 440b of the second stand unit 44 is pivotally connected to the to the first hole portion 422a1 of the corresponding first stand unit 42 (that is the first stand unit 42 at the lower right most corner of FIG. 7) and the third end 440a of the second body 440 abuts against the second end 420b of the first body 420 of the corresponding first stand unit 42, the first engaging portion 442 of the second stand unit 44 is engaged with the first engaging slot 420d of the corresponding first stand unit 42.

In addition, each of the first stand units 42 further comprises a second engaging portion 424. The second engaging portion 424 is connected to the first body 420 and located at the first end 420a of the first body 420. Except for the first stand unit 42 pivotally connected to the base 20 (that is the first stand unit 42 at the upper left most corner of FIG. 7), the second engaging portion 424 of each of the other first stand units 42 is engaged with the first engaging slot 402d of the corresponding first stand unit 42 when the first shaft 420c of the each of the other first stand units 42 is pivotally connected to the first hole portion 422a1 of the corresponding first stand unit 42 and the first end 420a of the first body 420 of the each of the other first stand units 22 abuts against the second end 420b of the first body 420 of the corresponding first stand unit 42.

FIG. 11A to FIG. 11D respectively depict four side views of FIG. 6B to show four support modes of the stand assembly 4. FIG. 11A to FIG. 11D respectively corresponds to FIG. 6B, FIG. 8B, FIG. 9B, and FIG. 10B.

Figure 11B:
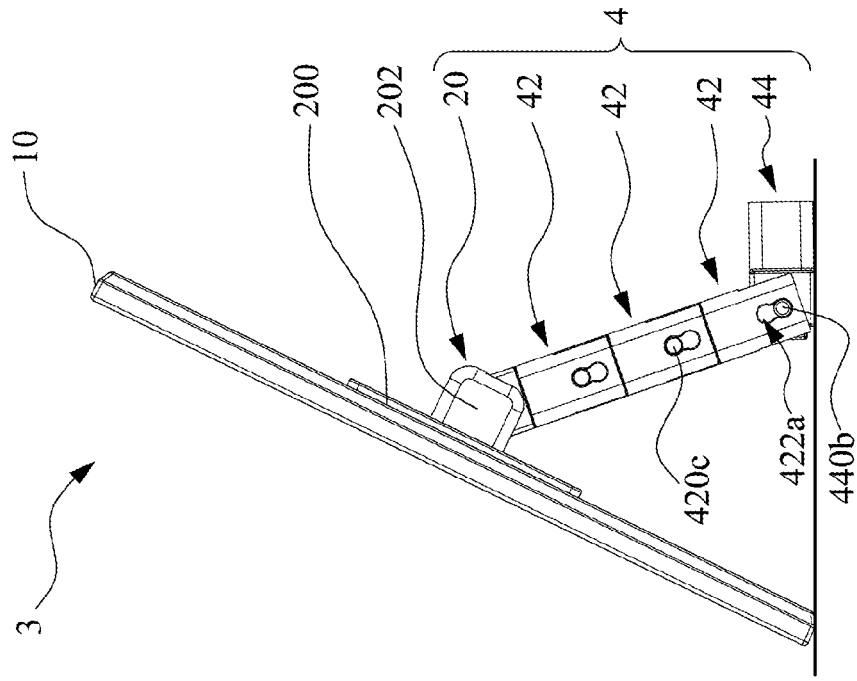
FIG. 11A to FIG. 11D respectively depict four side views of FIG. 6B to show four support modes of the stand assembly.
Figure 11A:
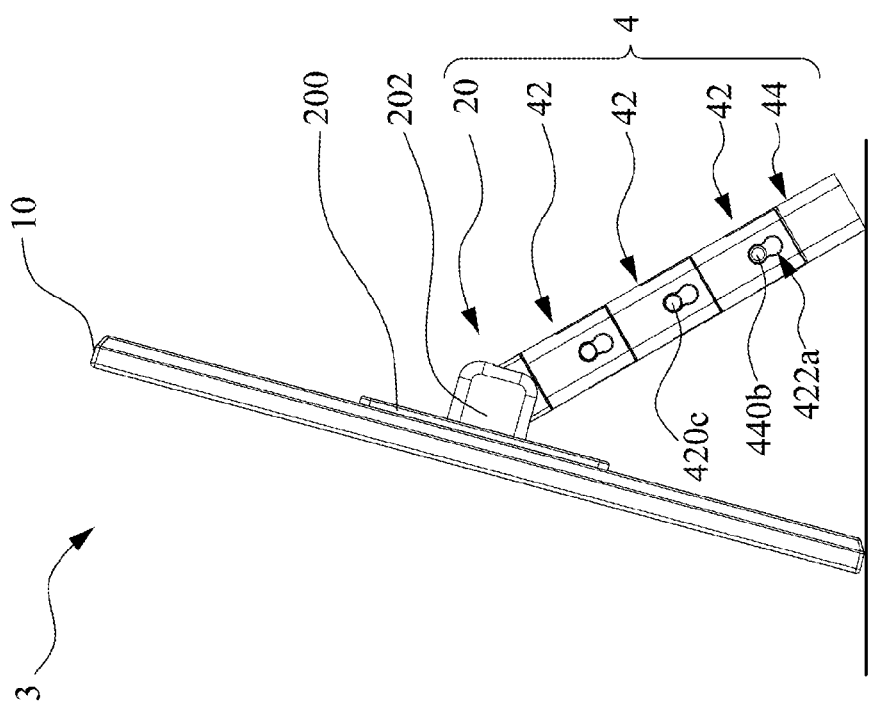
Figure 11D:
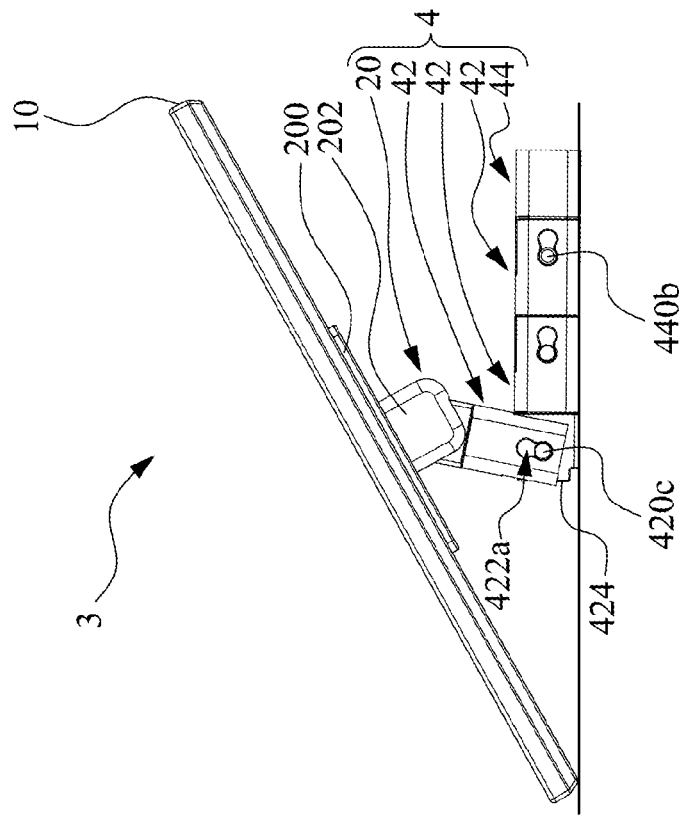
Figure 11C:
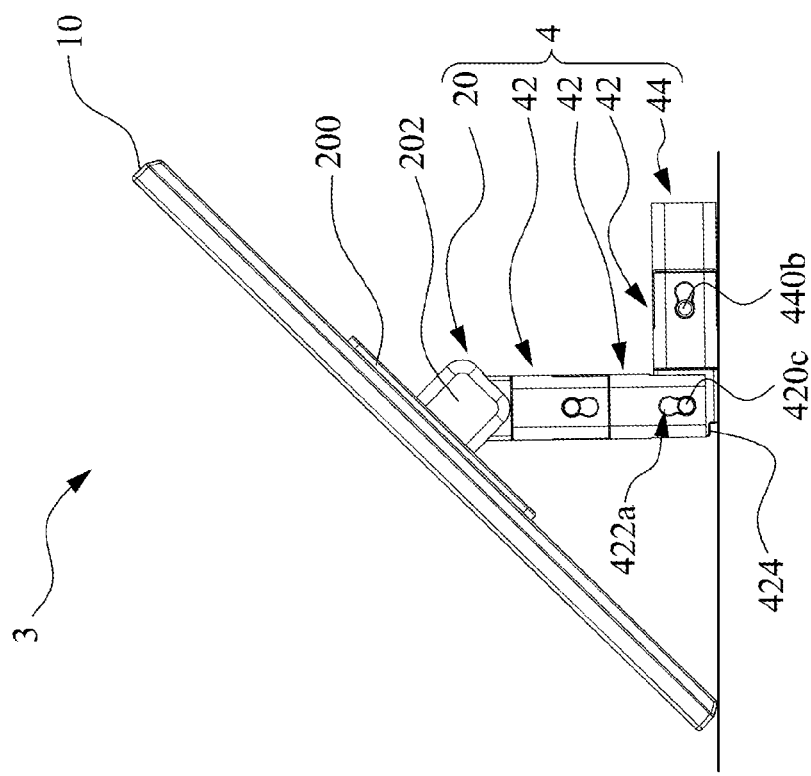

As shown in FIG. 11A, an angle formed between the chassis 10 and the horizontal plane is 80 degrees. As shown in FIG. 11B, the angle formed between the chassis 10 and the horizontal plane is 60 degrees. As shown in FIG. 11C, the angle formed between the chassis 10 and the horizontal plane is 45 degrees. As shown in FIG. 11D, the angle formed between the chassis 10 and the horizontal plane is 25 degrees. However, the present disclosure is not limited in this regard.

With the above detailed description of embodiments of the present disclosure, it is apparent that the base, the first stand unit(s), and the second stand unit of the present disclosure stand assembly are connected in sequence. Each of the two first stand units connected together can be rotated relative to the other first stand unit selectively, or each of the first stand unit and the second stand unit connected together can be rotated relative to each other. In this manner, the angle between the object being supported by the stand assembly (or the chassis of the electronic apparatus in the present disclosure) and the horizontal plane can be adjusted effectively. The present disclosure stand assembly achieves the supporting functions by assembling units to allow users to randomly adjust the angle and abandon the prior art stand assembly design in which the supporting function is achieved by the torque provided by a spring. Cost is also reduced because molds can be shared by each of the stand units. In addition, the whole stand assembly can be arranged in a line and adheres to the object (or the chassis of the electronic apparatus in the present disclosure) so as to be packaged conveniently and save cost of packaging material and packaging time.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. An electronic apparatus, comprising:
a chassis; and
a stand assembly, comprising:
  a base connected to the chassis;
  a first stand unit comprising a first body and an extending portion, the first body having a first end, a second end, and a first shaft, the extending portion being connected to the first body and extending away from the second end of the first body, the extending portion having a first shaft hole having a first hole portion and a second hole portion communicated with each other, and the first shaft being pivotally connected to the base, wherein the first shaft hole further comprises a first tightening portion raising between the first hole portion and the second hole portion, the first shaft hole has a first minimum width at the first tightening portion, wherein the first body further comprises a first engaging slot located at the second end; and
  a second stand unit comprising a second body, the second body having a third end and a second shaft, the second shaft being pivotally connected to the first hole portion or the second hole portion selectively by passing through the first tightening portion, when the second shaft being pivotally connected to the first hole portion, the third end abutting against the second end, when the second shaft being pivotally connected to the second hole portion, the third end leaving the second end so that the second stand unit is capable of rotating relative to the first stand unit, wherein the first minimum width is less than a diameter of the second shaft, wherein the second stand unit further comprises a first engaging portion connected to the second body and located at the third end, when the second shaft is pivotally connected to the first hole portion and the third end abuts against the second end, the first engaging portion is engaged with the first engaging slot;
wherein the base further comprises:
  a bottom plate connected to the chassis;
  a pivoting portion connected to the bottom plate, the pivoting portion having a second shaft hole having a third hole portion and a fourth hole portion communicated with each other, wherein the second shaft hole further comprises a second tightening portion raising between the third hole portion and the fourth hole portion, the second shaft hole has a second minimum width at the second tightening portion, the second minimum width is less than a diameter of the first shaft, the first shaft is pivotally connected to the third hole portion or the fourth hole portion selectively by passing through the second tightening portion; and
  a stop portion connected to the bottom plate, wherein when the first shaft is pivotally connected to the third hole portion, the first body abuts against the bottom plate and the first end abuts against the stop portion, when the first shaft is pivotally connected to the fourth hole portion, the first end leaves the stop portion so that the first stand unit is capable of rotating relative to the pivoting portion, when the first shaft is pivotally connected to the fourth hole portion and the first stand unit abuts against the stop portion by rotating from the bottom plate, the first stand unit has been rotated a predetermined angle relative to the pivoting portion.

2. The electronic apparatus of claim 1, wherein the stop portion has a second engaging slot, the first stand unit further comprises a second engaging portion, the second engaging portion is connected to the first body and located at the first end, when the first shaft is pivotally connected to the third hole portion and the first end abuts against the stop portion, the second engaging portion is engaged with the second engaging slot.

3. A stand assembly for an object, the stand assembly comprising:
 a base fixed to the object;
 a plurality of first stand units, each of the first stand units comprising a first body and an extending portion, the first body having a first end, a second end, and a first shaft, the extending portion being connected to the first body and extending away from the second end of the first body, the extending portion having a first shaft hole having a first hole portion and a second hole portion communicated with each other; and
 a second stand unit comprising a second body, the second body having a third end and a second shaft;
 wherein the base, the plurality of first stand units, and the second stand unit are sequentially connected, the first shaft of the first stand unit connected to the base is pivotally connected to the base, the first shaft of each of the other first stand units is pivotally connected to the first hole portion or the second hole portion of the first stand unit corresponding to said each of the other first stand units selectively, when the first shaft of said each of the other first stand units is pivotally connected to the first hole portion of the corresponding first stand unit, the first end of said each of the other first stand units abuts against the second end of the corresponding first stand unit, when the first shaft of said each of the other first stand units is pivotally connected to the second hole portion of the corresponding first stand unit, the first end of said each of the other first stand units leaves the second end of the corresponding first stand unit so that said each of the other first stand units is capable of rotating relative to the corresponding first stand unit;
 wherein the second shaft is pivotally connected to the first hole portion or the second hole portion of the first stand unit corresponding to the second stand unit selectively, when the second shaft is pivotally connected to the first hole portion of the corresponding first stand unit, the third end abuts against the second end of the corresponding first stand unit, when the second shaft is pivotally connected to the second hole portion of the corresponding first stand unit, the third end leaves the second end of the corresponding first stand unit so that the second stand unit is capable of rotating relative to the corresponding first stand unit.

4. The stand assembly of claim 3, wherein the first shaft hole further comprises a first tightening portion raising between the first hole portion and the second hole portion, the first shaft hole has a first minimum width at the first tightening portion, the first minimum width is less than a diameter of any of the first shafts and the second shaft.

5. The stand assembly of claim 4, wherein each of the first bodies further comprises a first engaging slot located at the second end, the second stand unit further comprises a first engaging portion, the first engaging portion is connected to the second body and located at the third end, when the second shaft is pivotally connected to the first hole portion of the corresponding first stand unit and the third end abuts against the second end of the corresponding first stand unit, the first engaging portion is engaged with the first engaging slot of the corresponding first stand unit.

6. The stand assembly of claim 5, wherein the base further comprises:
 a bottom plate fixed to the object; and
 a pivoting portion connected to the bottom plate, the pivoting portion having a second shaft hole having a third hole portion and a fourth hole portion communicated with each other, the first shaft of the first stand unit being pivotally connected to the base being pivotally connected to the third hole portion or the fourth hole portion selectively.

7. The stand assembly of claim 6, wherein the second shaft hole further comprises a second tightening portion raising between the third hole portion and the fourth hole portion, the second shaft hole has a second minimum width at the second tightening portion, the second minimum width is less than a diameter of any of the first shafts.

8. The stand assembly of claim 7 wherein the base further comprises a stop portion connected to the bottom plate, when the first shaft of the first stand unit being pivotally connected to the base is pivotally connected to the third hole portion, the first body of the first stand unit being pivotally connected to the base abuts against the bottom plate and the first end of the first body of the first stand unit being pivotally connected to the base abuts against the stop portion, when the first shaft of the first stand unit being pivotally connected to the base is pivotally connected to the fourth hole portion, the first end of the first body of the first stand unit being pivotally connected to the base leaves the stop portion so that the first stand unit being pivotally connected to the base is capable of rotating relative to the pivoting portion, when the first shaft of the first stand unit being pivotally connected to the base is pivotally connected to the fourth hole portion and the first stand unit being pivotally connected to the base abuts against the stop portion by rotating from the bottom plate, the first stand unit being pivotally connected to the base has been rotated a predetermined angle relative to the pivoting portion.

9. The stand assembly of claim 8, wherein the stop portion has a second engaging slot, each of the first stand units further comprises a second engaging portion, the second engaging portion is connected to the first body and located at the first end, when the first shaft of the first stand unit being pivotally connected to the base is pivotally connected to the third hole portion and the first end of the first stand unit being pivotally connected to the base abuts against the stop portion, the second engaging portion of the first stand unit being pivotally connected to the base is engaged with the second engaging slot, when the first shaft of said each of the other first stand units is pivotally connected to the first hole portion of the corresponding first stand unit and the first end of said each of the other first stand units abuts against the second end of the corresponding first stand unit, the second engaging portion of said each of the other first stand units is engaged with the first engaging slot of the corresponding first stand unit.

10. An electronic apparatus, comprising:
 a chassis; and
 a stand assembly, comprising:
  a base connected to the chassis;
  a plurality of first stand units, each of the first stand units comprising a first body and an extending portion, the first body having a first end, a second end, and a first shaft, the extending portion being connected to the first body and extending away from the second end of the first body, the extending portion having a first shaft hole having a first hole portion and a second hole portion communicated with each other; and a second stand unit comprising a second body, the second body having a third end and a second shaft; wherein the base, the plurality of first stand units, and the second stand unit are sequentially connected, the first shaft of the first stand unit connected to the base is pivotally connected to the base, the first shaft of each of the other first stand units is pivotally connected to the first hole portion or the second hole portion of the first stand unit corresponding to said each of the other first stand units selectively, when the first shaft of said each of the other first stand units is pivotally connected to the first hole portion of the corresponding first stand unit, the first end of said each of the other first stand units abuts against the second end of the corresponding first stand unit, when the first shaft of said each of the other first stand units is pivotally connected to the second hole portion of the corresponding first stand unit, the first end of said each of the other first stand units leaves the second end of the corresponding first stand unit so that said each of the other first stand units is capable of rotating relative to the corresponding first stand unit;

wherein the second shaft is pivotally connected to the first hole portion or the second hole portion of the first stand unit corresponding to the second stand unit selectively, when the second shaft is pivotally connected to the first hole portion of the corresponding first stand unit, the third end abuts against the second end of the corresponding first stand unit, when the second shaft is pivotally connected to the second hole portion of the corresponding first stand unit, the third end leaves the second end of the corresponding first stand unit so that the second stand unit is capable of rotating relative to the corresponding first stand unit.

11. The electronic apparatus of claim 10, wherein the first shaft hole further comprises a first tightening portion raising between the first hole portion and the second hole portion, the first shaft hole has a first minimum width at the first tightening portion, the first minimum width is less than a diameter of any of the first shafts and the second shaft.

12. The electronic apparatus of claim 11, wherein each of the first bodies further comprises a first engaging slot located at the second end, the second stand unit further comprises a first engaging portion, the first engaging portion is connected to the second body and located at the third end, when the second shaft is pivotally connected to the first hole portion of the corresponding first stand unit and the third end abuts against the second end of the corresponding first stand unit, the first engaging portion is engaged with the first engaging slot of the corresponding first stand unit.

13. The electronic apparatus of claim 12, wherein the base further comprises:
a bottom plate connected to the chassis; and
a pivoting portion connected to the bottom plate, the pivoting portion having a second shaft hole having a third hole portion and a fourth hole portion communicated with each other, the first shaft of the first stand unit being pivotally connected to the base being pivotally connected to the third hole portion or the fourth hole portion selectively.

14. The electronic apparatus of claim 13, wherein the second shaft hole further comprises a second tightening portion raising between the third hole portion and the fourth hole portion, the second shaft hole has a second minimum width at the second tightening portion, the second minimum width is less than a diameter of any of the first shafts.

15. The electronic apparatus of claim 14, wherein the base further comprises a stop portion connected to the bottom plate, when the first shaft of the first stand unit being pivotally connected to the base is pivotally connected to the third hole portion, the first body of the first stand unit being pivotally connected to the base abuts against the bottom plate and the first end of the first body of the first stand unit being pivotally connected to the base abuts against the stop portion, when the first shaft of the first stand unit being pivotally connected to the base is pivotally connected to the fourth hole portion, the first end of the first body of the first stand unit being pivotally connected to the base leaves the stop portion so that the first stand unit being pivotally connected to the base is capable of rotating relative to the pivoting portion, when the first shaft of the first stand unit being pivotally connected to the base is pivotally connected to the fourth hole portion and the first stand unit being pivotally connected to the base abuts against the stop portion by rotating from the bottom plate, the first stand unit being pivotally connected to the base has been rotated a predetermined angle relative to the pivoting portion.

16. The electronic apparatus of claim 15, wherein the stop portion has a second engaging slot, each of the first stand units further comprises a second engaging portion, the second engaging portion is connected to the first body and located at the first end, when the first shaft of the first stand unit being pivotally connected to the base is pivotally connected to the third hole portion and the first end of the first stand unit being pivotally connected to the base abuts against the stop portion, the second engaging portion of the first stand unit being pivotally connected to the base is engaged with the second engaging slot, when the first shaft of said each of the other first stand units is pivotally connected to the first hole portion of the corresponding first stand unit and the first end of said each of the other first stand units abuts against the second end of the corresponding first stand unit, the second engaging portion of said each of the other first stand units is engaged with the first engaging slot of the corresponding first stand unit.

* * * * *